US006645858B2

United States Patent
Pyo et al.

(10) Patent No.: US 6,645,858 B2
(45) Date of Patent: *Nov. 11, 2003

(54) METHOD OF CATALYZING COPPER DEPOSITION IN A DAMASCENE STRUCTURE BY PLASMA TREATING THE BARRIER LAYER AND THEN APPLYING A CATALYST SUCH AS IODINE OR IODINE COMPOUNDS TO THE BARRIER LAYER

(75) Inventors: Sung Gyu Pyo, Ichon-Shi (KR); Si Bum Kim, Seoul (KR)

(73) Assignee: Hyundai Electronics Industries Co., Kyungki-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/875,625

(22) Filed: Jun. 6, 2001

(65) Prior Publication Data

US 2001/0053603 A1 Dec. 20, 2001

(30) Foreign Application Priority Data

Jun. 15, 2000 (KR) .......................... 2000-32918

(51) Int. Cl.[7] ..................... H01L 21/44; H01L 21/4763; H05H 1/00
(52) U.S. Cl. ................. 438/677; 438/627; 438/687; 427/533; 427/535
(58) Field of Search ................... 438/687, 627–629, 438/677, 637; 427/123, 124, 533, 535

(56) References Cited

U.S. PATENT DOCUMENTS

| | | | | |
|---|---|---|---|---|
| 5,767,301 A | * | 6/1998 | Senzaki et al. ................ 556/9 |
| 6,107,192 A | * | 8/2000 | Subrahmanyan et al. ... 438/637 |
| 6,121,140 A | * | 9/2000 | Arena et al. ................. 438/677 |
| 6,143,658 A | * | 11/2000 | Donnelly et al. ........... 438/652 |
| 6,291,343 B1 | * | 9/2001 | Tseng et al. ................. 427/532 |
| 6,297,147 B1 | * | 10/2001 | Yang et al. ................. 438/627 |
| 6,365,502 B1 | * | 4/2002 | Paranjpe et al. ............ 438/622 |
| 6,436,826 B1 | * | 8/2002 | Pyo ............................. 438/687 |
| 6,468,907 B2 | * | 10/2002 | Pyo ............................. 438/687 |
| 2001/0019891 A1 | * | 9/2001 | Koh et al. .................. 438/687 |
| 2002/0052110 A1 | * | 5/2002 | Pyo ............................. 438/687 |

FOREIGN PATENT DOCUMENTS

WO  WO 02/63666 A1 * 8/2002

OTHER PUBLICATIONS

Hwang et al. "Surfactant-assisted metallorganic CVD of (111)-oriented copper films with excellent surface smoothness" Electrochemical and Solid State Letters 3(3), Mar. 2000, pp. 138–140.*

Wolf, et al. Silicon Processing for the VLSI Era, vol. 1–Process Technology, 2nd ed., Lattice Press: Sunset Beach CA, 2000, pp. 799–801.*

* cited by examiner

Primary Examiner—Erik Kielin
(74) Attorney, Agent, or Firm—Marshall, Gerstein & Borun LLP

(57) ABSTRACT

A method of manufacturing a copper metal wiring in a semiconductor device, by which a plasma process is performed before a diffusion barrier layer is formed and a chemical pre-process using a chemical enhancer is performed so that copper is deposited to form a metal wiring by a chemically enhanced chemical vapor deposition (CECVD) method. The method allows the chemical enhancer to be adhered on the diffusion barrier layer uniformly and stably; therefore, improving the deposition property of a copper thin film.

24 Claims, 2 Drawing Sheets

METHOD OF CATALYZING COPPER DEPOSITION IN A DAMASCENE STRUCTURE BY PLASMA TREATING THE BARRIER LAYER AND THEN APPLYING A CATALYST SUCH AS IODINE OR IODINE COMPOUNDS TO THE BARRIER LAYER

BACKGROUND OF THE INVENTION

1. Field of the Invention

The invention relates generally to a method of manufacturing a copper metal wiring in a semiconductor device. More particularly, the invention relates to a method of manufacturing a copper metal wiring in a semiconductor device capable of increasing absorption sites of a chemical enhancer when copper is deposited to form a metal wiring through a chemically enhanced chemical vapor deposition (CECVD) method.

2. Background of the Invention

As the performance of next-generation semiconductor device increases, the size of a contact is reduced and the aspect ratio increases. Therefore, when a metal wiring is formed, a good contact filling property and a step coverage is required.

Presently, the manufacture of a metal wiring in a semiconductor device uses a method by which, after a titanium thin film (Ti) is deposited, aluminum (Al) is deposited thereon by a physical vapor deposition (PVD) method and a chemical vapor deposition (CVD) method, or tantalum (Ta) or tantalum nitride (TaN) thin film is formed as a diffusion prevention film by a PVD method and copper (Cu) is deposited by an electroplating method. This current methodology, however, has a problem when applied to next-generation high-performance semiconductor devices since aluminum is higher in resistance than copper. In the latter method, copper is limited in its filling property due to an abrupt reduction in the contact size and an increase in the aspect ratio. Further, the tantalum nitride film used as a diffusion prevention film for copper must be very thin, which increases the resistance relative to aluminum to which a diffusion prevention film is not applied. Thus, applying the copper wiring to the next-generation semiconductor device or using aluminum wiring and electroplating causes many problems. In order to solve these problems, study of a method by which a CVD method is employed upon deposition of the copper wiring has recently been emphasized. However, due to a lower deposition speed, this method has a limit in bulk filling.

Recently, a method by which a copper thin film is deposited by means of a metal organic chemical vapor deposition (MOCVD) method using a catalyst that includes iodine (I) has been studied. The MOCVD method using this catalyst is called a chemically enhanced chemical vapor deposition (CECVD) method. The chemical enhancer, e.g., iodine, heavily depends on the surface property of a diffusion barrier layer. Further, if the chemical enhancer is directly deposited on the diffusion barrier layer without deposition of a seed, the absorption property of the chemical enhancer is degraded. In other words, in case of an amorphous layer or a dense thin film which does not provide a site on which the diffusion barrier layer can be deposited in a stable manner, the chemical enhancer will rarely adhere to the diffusion barrier layer and the chemically enhanced effect will be diminished. Therefore, there is a problem that a filling property of a copper metal wiring will be degraded.

SUMMARY OF THE DISCLOSURE

A method of manufacturing a copper metal wiring in a semiconductor device is disclosed and comprises the steps of forming an interlayer insulating film on a substrate in which an underlying structure is formed; forming a damascene pattern; performing a cleaning process; forming a diffusion barrier layer on the entire structure in which the damascene pattern is formed; performing a plasma process for the entire structure in which the diffusion barrier layer is formed; performing a chemical pre-process using a chemical enhancer for the diffusion barrier layer for which the plasma process is performed; depositing copper on the entire structure so that the damascene pattern can be filled; and performing a chemical mechanical polish process so that the damascene pattern can be filled, thus forming a copper metal wiring only within the damascene pattern.

BRIEF DESCRIPTION OF THE DRAWINGS

The aforementioned aspects and other features of the disclosed method will be explained in the following description, taken in conjunction with the accompanying drawings, wherein.

DETAILED DESCRIPTION OF THE PRESENTLY PREFERRED EMBODIMENTS

A method of manufacturing a copper metal wiring in a semiconductor device is disclosed that maximizes the adhesion property of a chemical enhancer on the surface of a diffusion barrier layer and thus improves the filling property of copper, by performing a plasma process after the chemical enhancer is deposited while a copper metal wiring is formed by means of a chemically enhanced chemical vapor deposition (CECVD) method. The invention will be described in detail by way of a preferred embodiment with reference to accompanying drawings.

Figure 1A:
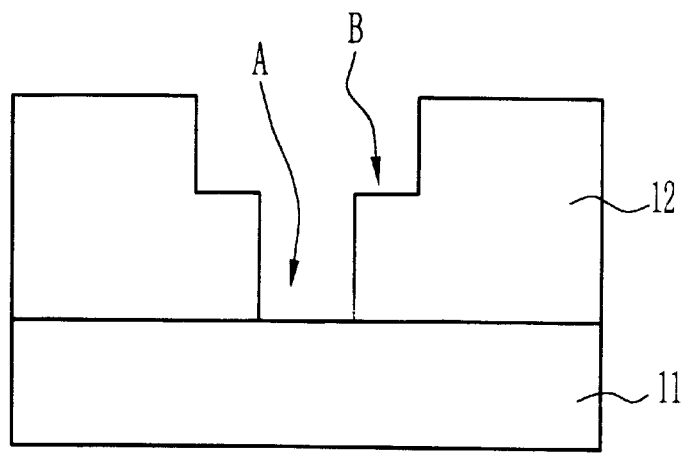
FIGS. 1A to 1E are cross-sectional views for explaining a method of manufacturing a copper metal wiring in a semiconductor device according to one preferred embodiment.

As shown in FIG. 1A, an interlayer insulating film 12 is formed on a substrate 11 in which an underlying structure is formed. Then, the interlayer insulating film 12 is patterned by a single damascene or a dual damascene process to form a damascene pattern consisting of a contact A and a trench B. After that, a cleaning process is performed. At this time, the interlayer insulating film 12 is formed by depositing insulating materials having a low dielectric constant. The cleaning process is performed using RF plasma when the bottom layer is a metal layer such as tungsten, aluminum, and a suitable like metal, and is performed using a reactive cleaning method when the bottom layer is a metal layer made of copper.

Figure 1B:
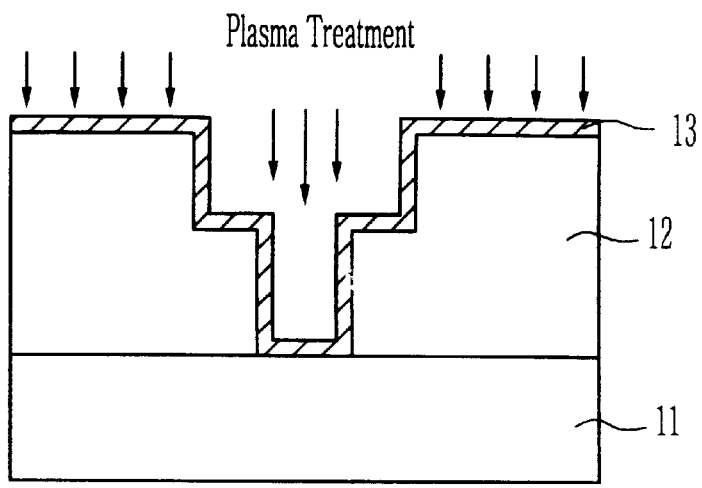

As shown in FIG. 1B, after a diffusion barrier layer 13 is formed on the entire structure in which the damascene pattern is formed, a plasma process is performed.

The diffusion barrier layer 13 is formed by one of the following: depositing titanium nitride (TiN) by a method that includes ionized PVD, CVD and MOCVD methods, tantalum (Ta) or tantalum nitride (TaN) by ionized PVD method or CVD method, tungsten nitride (WN) by CVD method, and a titanium compound including aluminum nitride (TiAlN), titanium silicon nitride (TiSiN) and tantalum silicon nitride (TaSiN) by PVD or CVD method.

The plasma process performed after the diffusion barrier layer 13 is formed serves to maximize the adhesion effect of a chemical enhancer deposited by a subsequent process, which is either a remote plasma method or plasma etch method. In the remote plasma method, reactive treatment is employed to increase adhesion sites of the chemical enhancer. In the plasma etch method, single or dual frequency etch is possible. The plasma process may be performed using a single gas that includes hydrogen, argon, and nitrogen, or using a gas mixture of hydrogen and argon. The plasma process may be performed in a single step or may be performed in multiple steps of between 1 and about 10 steps.

The supply power used for the plasma process ranges from about 50 W to about 10 kW, and the process time ranges from about 1 second to about 10 minutes. Also, in case of performing the plasma process using a single gas such as hydrogen, nitrogen, argon and helium, the flow rate of each of the single gases ranges from about 50 standard cubic centimeter per minute (sccm) to about 500 sccm. In the mixture gas, the hydrogen content ranges from about 5% to about 95% and the argon content ranges from about 5% to about 95%.

Meanwhile, when using the single step, either a single gas or a mixture of the single gases may be used. In the multiple step process, after the single gas of argon or the mixture gas is first used, the process using hydrogen gas is repeated from 1 to about 10 times.

During the plasma process, within the chamber containing a showerhead and substrate, the temperature of the substrate is kept between about 10° C. and about 350° C.; the distance between substrate and shower head is between about 5 mm and about 50 mm and the pressure within the chamber ranges from about 0.3 Torr to about 10 Torr.

Figure 1C:
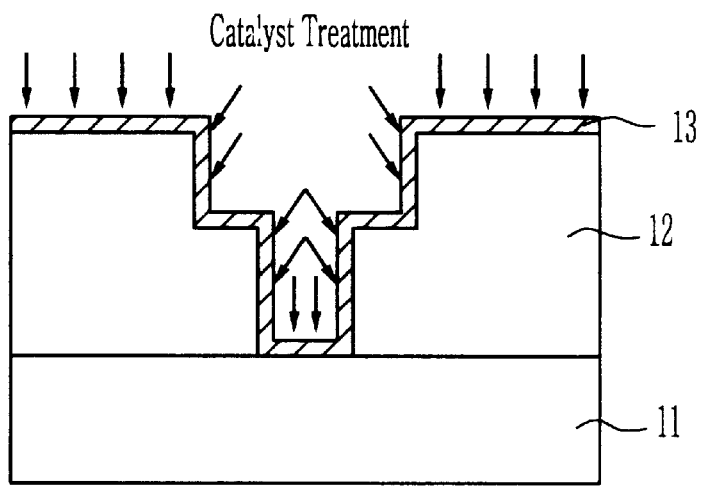

As shown in FIG. 1C, a chemical pre-process using a catalyst, which is a chemical enhancer, is performed on the diffusion barrier layer 13, which underwent the plasma process as discussed above. At this time, the chemical enhancer may use an iodine-containing liquid compound, which includes: Hhfac:$H_2O$ (1:2), Hhfac and TMVS (trimethylvinylsilane), pure iodine, iodine-containing gas, iodine-containing water vapor, and liquid and gas state of group VII elements, e.g., F, Cl, Br, I, and At, and liquid and gas states of compounds thereof, wherein the process time is from about 1 second to about 10 minutes. Also, the catalyst process temperature ranges from about −20° C. to about 300° C.

Figure 1D:
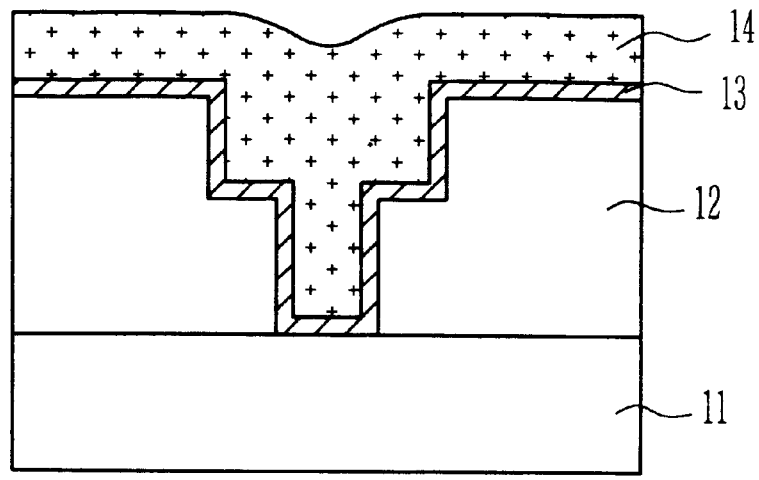

As shown in FIG. 1D, a copper metal wiring 14 is formed on the entire structure so that the damascene pattern can be filled.

The filling with copper may be formed by use of all kinds of copper precursors using hfac such as, for example, Cu(hfac)VTMOS series, Cu(hfac)DMB series, and copper hexafluoroacetylacetonate trimethylvinylsilane (Cu(hfac) TMVS) series, and is deposited by means of MOCVD method using all the deposition equipments on which a liquid delivery system (LDS) such as a direct liquid injection (DLI), a control evaporation mixer (CEM), an orifice, and a spray, are mounted. The flow rate of the copper precursor ranges from about 0.1 sccm to about 5.0 sccm.

Also, when the copper metal wiring is formed, a carrier gas that includes helium, hydrogen, and argon, is used at flow rates between about 100 sccm and about 700 sccm. The pressure within the reactive chamber ranges from about 0.5 Torr to about 5 Torr, and the temperature within the reactive chamber is kept about the same as that of the deposition equipment, and the temperature of the shower head is controlled to be constant.

Further, the deposition temperature of copper ranges from about 50° C. to about 300° C. and the distance between the shower head and the susceptor plate within the reactive chamber is maintained between about 5 mm and about 50 mm.

After copper is filled by the above method, a thermal process is performed under hydrogen reduction atmosphere at a temperature from about room temperature to about 450° C. for about 1 minute to about 3 hours, so that the shape of grain texture can be changed. The hydrogen reduction atmosphere at this time may use $H_2$ or a hydrogen mixture gas in which Ar comprises from about 0 to about 95% or $N_2$ is mixed into $H_2$.

Figure 1E:
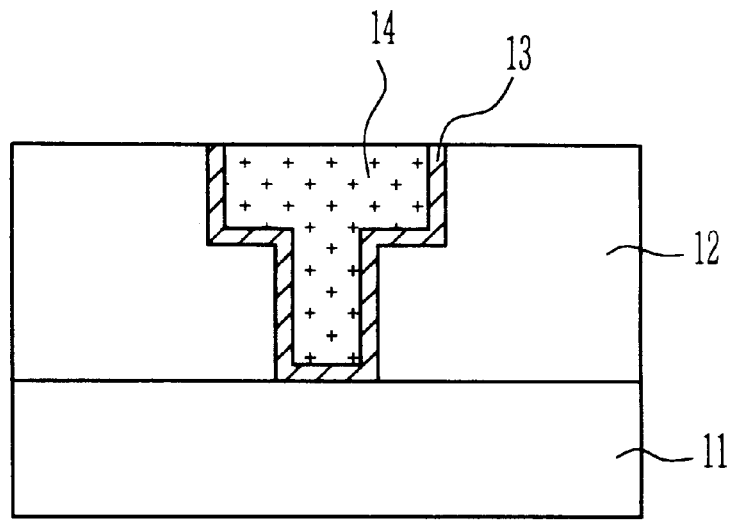

As shown in FIG. 1E, chemical mechanical polish (CMP) process is performed so that the copper metal wiring 14 is maintained at the damascene pattern, thus exposing the surface of the interlayer insulating film 13. Then a cleaning process is performed.

An illustration of the present invention has been described with reference to a particular application. Those having ordinary skill in the art and access to the teachings of the present invention will recognize additional modifications and applications within the scope thereof.

Therefore, the appended claims are intended to cover any and all such applications, modifications, and embodiments within the scope of the teachings of the present invention.

What is claimed are:

1. A method of manufacturing a copper metal wiring in a semiconductor device, comprising the step of:
    forming an interlayer insulating film on a substrate in which an underlying structure is formed;
    forming a damascene pattern on the interlayer insulating film to provide a contact hole through the interlayer insulating film to the substrate;
    performing a cleaning process;
    forming a diffusion barrier layer on entire structure;
    performing a plasma process without exposing the interlayer insulating film or substrate disposed beneath the diffusion barrier layer;
    performing a chemical pre process on the diffusion barrier layer using a chemical enhancer selected from the group consisting of: an iodine-containing liquid compound, an iodine-containing gas, an iodine-containing water vapor, and a compound comprising at least one group VII element; to provide a catalyzed diffusion barrier layer; depositing copper on the catalyzed diffusion barrier layer to fill the damascene pattern; and
    performing a chemical mechanical polish process forming a copper metal wiring only within the damascene pattern.

2. The method of manufacturing a copper metal wiring in a semiconductor device according to claim 1, wherein the underlying structure comprises a bottom layer comprising a metal layer selected from the group consisting of tungsten and aluminum, and the cleaning process comprises use of a RF plasma.

3. The method of manufacturing a copper metal wiring in a semiconductor device according to claim 1, wherein the underlying structure comprises a bottom layer comprising copper and the cleaning process comprises a reactive cleaning method.

4. The method of manufacturing a copper metal wiring in a semiconductor device according to claim 1, wherein the step of forming the diffusion barrier layer is selected from the group consisting of:
    depositing titanium nitride by a method selected from the group consisting of ionized PVD, CVD and MOCVD methods;
    depositing tantalum or tantalum nitride by the ionized PVD or the CVD method;

depositing tungsten nitride by the CVD method; and depositing a compound selected from the group consisting of aluminum nitride, titanium silicon nitride and tantalum silicon nitride by the PVD or the CVD method.

5. The method of manufacturing a copper metal wiring in a semiconductor device according to claim 1, wherein the step of performing the plasma process uses a remote plasma method or a plasma etch method.

6. The method of manufacturing a copper metal wiring in a semiconductor device according to claim 1, wherein the step of performing the plasma process uses a single gas selected from the group consisting of hydrogen, argon, nitrogen and helium.

7. The method of manufacturing a copper metal wiring in a semiconductor device according to claim 6, wherein the step of performing the plasma process comprises delivering the single gas at a the flow rate from about 50 sccm to about 500 sccm.

8. The method of manufacturing a copper metal wiring in a semiconductor device according to claim 1, wherein the step of performing the plasma process uses a gas mixture comprising hydrogen and argon.

9. The method of manufacturing a copper metal wiring in a semiconductor device according to claim 8, wherein the gas mixture comprises from about 5% to about 95% hydrogen and from about 5% to about 95% argon.

10. The method of manufacturing a copper metal wiring in a semiconductor device according to claim 1, wherein the step of performing the plasma process is performed in a single step or in multiple steps comprising from 1 to about 10 steps.

11. The method of manufacturing a copper metal wiring in a semiconductor device according to claim 1, wherein the step of performing the plasma process comprises using a power supply ranging from about 50 W to about 10 kW and the process time ranges from about 1 second to about 10 minutes.

12. The method of manufacturing a copper metal wiring in a semiconductor device according to claim 1, wherein the plasma process is performed in a single step and utilizes a mixture of gases.

13. The method of manufacturing a copper metal wiring in a semiconductor device according to claim 1, wherein the step of performing the plasma process is performed in multiple steps comprising a first step utilizing a single gas of argon or a mixture of gases, and a subsequent step using hydrogen gas that is repeated from about 1 to about 10 times.

14. The method of manufacturing a copper metal wiring in a semiconductor device according to claim 1, wherein the plasma process is carried out in a chamber comprising a showerhead and the plasma process comprises:

maintaining a temperature of the substrate between about 10° C. and about 350° C.;

maintaining a distance between the substrate and the showerhead between about 5 mm about 50 mm; and maintaining a pressure within the chamber that houses the substrate between about 0.3 Torr and about 10 Torr.

15. The method of manufacturing a copper metal wiring in a semiconductor device according to claim 1, wherein the copper depositing step is carried out in a reaction chamber and comprises maintaining a distance between a shower head and a susceptor plate within the reaction chamber between about 5 mm and about 50 mm.

16. The method of manufacturing a copper metal wiring in a semiconductor device according to claim 1, wherein the chemical preprocess is performed for a time period ranging from about 1 second to about 10 minutes.

17. The method of manufacturing a copper metal wiring in a semiconductor device according to claim 1, wherein the chemical preprocess is performed at a temperature ranging from about −20° C. to about 300° C.

18. The method of manufacturing a copper metal wiring in a semiconductor device according to claim 1, wherein the copper depositing step comprises the use of copper precursors with hfac selected from the group consisting of Cu(hfac)VTMOS series, Cu(hfac)DMB series, and copper hexafluoroacetylacetonate trimethylvinylsilane (Cu(hfac)TMVS) series.

19. The method of manufacturing a copper metal wiring in a semiconductor device according to claim 1, wherein the copper depositing step comprises the use of a copper precursor having a flow rate ranging from about 0.1 sccm to about 5.0 sccm.

20. The method of manufacturing a copper metal wiring in a semiconductor device according to claim 1, wherein the copper depositing step comprises delivering carrier gases selected from the group consisting of helium, hydrogen, and argon at a flow rate ranging from about 100 sccm to about 700 sccm.

21. The method of manufacturing a copper metal wiring in a semiconductor device according to claim 1, wherein the copper depositing step comprises maintaining a pressure within a reactive chamber ranging from about 0.5 Torr to about 5 Torr.

22. The method of manufacturing a copper metal wiring in a semiconductor device according to claim 1, wherein the copper depositing step comprises maintaining a temperature of the device between about 50° C. and about 300° C.

23. The method of manufacturing a copper metal wiring in a semiconductor device according to claim 1, wherein the copper depositing step comprises performing a thermal process under a hydrogen reduction atmosphere at a temperature ranging from about room temperature to about 450° C. for a time period ranging from about 1 minute to about 3 hours.

24. The method of manufacturing a copper metal wiring in a semiconductor device according to claim 23, wherein the copper depositing step comprises utilizing hydrogen or a gas mixture comprising hydrogen argon and nitrogen, or a gas mixture comprising hydrogen and nitrogen.

\* \* \* \* \*

UNITED STATES PATENT AND TRADEMARK OFFICE
CERTIFICATE OF CORRECTION

PATENT NO. : 6,645,858 B2
DATED : November 11, 2003
INVENTOR(S) : Sung G. Pyo et al.

It is certified that error appears in the above-identified patent and that said Letters Patent is hereby corrected as shown below:

<u>Title page,</u>
Item [75], Inventors, please delete "Ichon-Shi" and replace with -- Kyungki-do --.

<u>Column 6,</u>
Lines 11 and 15, please delete "preprocess" and replace with -- pre-process --.

Signed and Sealed this

Sixth Day of April, 2004

JON W. DUDAS
*Acting Director of the United States Patent and Trademark Office*